(12) United States Patent
Clampitt

(10) Patent No.: US 6,723,602 B2
(45) Date of Patent: *Apr. 20, 2004

(54) METHOD FOR SPACER PATTERNED, HIGH DIELECTRIC CONSTANT CAPACITOR

(75) Inventor: Darwin A. Clampitt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/185,836

(22) Filed: Jun. 28, 2002

(65) Prior Publication Data

US 2002/0164854 A1 Nov. 7, 2002

Related U.S. Application Data

(60) Continuation of application No. 09/718,914, filed on Nov. 22, 2000, now Pat. No. 6,458,654, which is a continuation of application No. 09/234,282, filed on Jan. 19, 1999, now Pat. No. 6,190,965, which is a division of application No. 08/994,849, filed on Dec. 19, 1997, now Pat. No. 6,150,691.

(51) Int. Cl.$^7$ .......................................... H01L 21/8242
(52) U.S. Cl. ....................... 438/255; 438/253; 438/254; 438/239
(58) Field of Search ................................. 438/255, 253, 438/254, 239, 653, 655, 637; 257/751, 754

(56) References Cited

U.S. PATENT DOCUMENTS

| 5,187,638 A | 2/1993 | Sandhu et al. |
|---|---|---|
| 5,187,639 A | 2/1993 | Ogawa et al. |
| 5,206,183 A | 4/1993 | Dennison |
| 5,335,138 A | 8/1994 | Sandhu et al. |
| 5,381,302 A | 1/1995 | Sandhu et al. |
| 5,392,189 A | 2/1995 | Fazan et al. |
| 5,401,680 A | 3/1995 | Abt et al. |
| 5,405,796 A | 4/1995 | Jones, Jr. |
| 5,478,772 A | 12/1995 | Fazan |
| 5,633,189 A | 5/1997 | Yen et al. |
| 5,717,250 A | 2/1998 | Schuele et al. |
| 5,759,891 A | 6/1998 | Tseng |
| 5,763,321 A | 6/1998 | Ohshima et al. |
| 5,795,806 A | 8/1998 | Tseng |
| 5,824,563 A | 10/1998 | Hwang |
| 5,834,357 A | 11/1998 | Kang |
| 5,893,734 A | 4/1999 | Jeng et al. |
| 5,966,612 A | 10/1999 | Wu |
| 6,022,775 A | 2/2000 | Tsai et al. |
| 6,150,691 A | 11/2000 | Clampitt |
| 6,190,965 B1 | 2/2001 | Clampitt |

*Primary Examiner*—George Eckert
*Assistant Examiner*—N. Drew Richards
(74) *Attorney, Agent, or Firm*—TraskBritt

(57) ABSTRACT

A high dielectric constant memory cell capacitor and method for producing the same, wherein the memory cell capacitor utilizes relatively large surface area conductive structures of thin spacer width pillars or having edges without sharp corners that lead to electric field breakdown of the high dielectric constant material. The combination of high dielectric constant material in a memory cell along with a relatively large surface area conductive structure is achieved through the use of a buffer material as caps on the thin edge surfaces of the relatively large surface area conductive structures to dampen or eliminate the intense electric field which would be generated at the corners of the structures during the operation of the memory cell capacitor had the caps not been present.

22 Claims, 17 Drawing Sheets

METHOD FOR SPACER PATTERNED, HIGH DIELECTRIC CONSTANT CAPACITOR

CROSS-REFERENCE TO RELATED APPLICATIONS

This application is a continuation of application Ser. No. 09/718,914, filed Nov. 22, 2000, now U.S. Pat. No. 6,458,654, issued Oct. 1, 2002, which is a continuation of application Ser. No. 09/234,282, filed Jan. 19, 1999, now U.S. Pat. No. 6,190,965, issued Feb. 20, 2001, which is a divisional of application Ser. No. 08/994,849, filed Dec. 19, 1997, now U.S. Pat. No. 6,150,691, issued Nov. 21, 2000.

BACKGROUND OF THE INVENTION

1. Field of the Invention

The present invention relates to a memory cell capacitor and method for producing the same. More particularly, the present invention relates to a method of forming high dielectric constant memory cell capacitors which utilize relatively large surface area structures without electric field breakdown of the high dielectric constant material on the relatively large surface area structures.

2. State of the Art

A widely utilized DRAM (Dynamic Random Access Memory) manufacturing process utilizes CMOS (Complementary Metal Oxide Semiconductor) technology to produce DRAM circuits which comprise an array of unit memory cells, each including one capacitor and one transistor, such as a field effect transistor. In the most common circuit designs, one side of the transistor is connected to one side of the capacitor, the other side of the transistor and the transistor gate are connected to external circuit lines called the bit line and the word line, and the other side of the capacitor is connected to a reference voltage that is typically one-half the internal circuit voltage. In such memory cells, an electrical signal charge is stored in a storage node of the capacitor connected to the transistor that charges and discharges the circuit lines of the capacitor.

Higher performance, lower cost, increased miniaturization of components, and greater packaging density of integrated circuits are ongoing goals of the computer industry. The advantages of increased miniaturization of components include: reduced-bulk electronic equipment, improved reliability by reducing the number of solder or plug connections, lower assembly and packaging costs, and improved circuit performance. In pursuit of increased miniaturization, DRAM chips have been continually redesigned to achieve ever higher degrees of integration. However, as the dimensions of the DRAM chips are reduced while at the same time memory capacity is increased, the occupation area of each unit memory cell of the DRAM chips must be reduced. This reduction in occupied area necessarily results in a reduction of the dimensions of the cell capacitor, which, in turn, makes it difficult to ensure required storage capacitance for transmitting a desired signal without malfunction. However, the ability to densely pack the unit memory cells, while maintaining required capacitance levels, is a crucial requirement of semiconductor manufacturing if future generations of ever higher memory capacitor DRAM chips are to be successfully manufactured.

In order to minimize a decrease in storage capacitance caused by the reduced occupied area of the capacitor, the capacitor should have a relatively large surface area or a high dielectric constant dielectric layer in the capacitor. With regard to increasing capacitor surface area, there have been a variety of methods proposed for achieving this goal, including forming the capacitor such that various three-dimensional shapes extend therefrom. These three-dimensional shapes may include fins, cylinders, and boxes, as well as forming rough surfaces on these shapes.

With regard to the use of a high dielectric constant capacitor layer, the dielectric constant is a value characteristic of a material which is proportional to the amount of charge that can be stored in the material when it is interposed between two electrodes. High dielectric constant materials which can be used include $Ba_xSr_{(2-x)}TiO_3$ [BST], $BaTiO_3$, $SrTiO_3$, $PbTiO_3$, $Pb(Zr,Ti)O_3$ [PZT], $(Pb,La,Zr,Ti)O_3$ [PLZT], $(Pb,La)TiO_3$ [PLT], $KNO_3$, and $LiNbO_3$. Unfortunately, most high dielectric constant materials are incompatible with existing processes and cannot be simply deposited on a polysilicon electrode as are presently utilized dielectric materials, such as $Si_3N_4$, $SiO_2/SiN_4$, and $Si_3N_4/SiO_2$ composite layers. The incompatibility is a result of the $O_2$ rich ambient atmosphere present during high dielectric constant material deposition or during annealing steps. The $O_2$ oxidizes portions of the material used for the storage node plate.

U.S. Pat. No. 5,381,302 issued Jan. 10, 1995 to Sandhu et al. teaches methods for fabricating capacitors compatible with high dielectric constant materials wherein a storage node electrode is provided with a barrier layer, such as titanium nitride, which prohibits diffusion of atoms. A recessed conductive plug of polysilicon is deposited in a via, wherein a titanium layer is deposited on the conductive plug. A rapid thermal anneal is then performed to form a titanium silicide layer. The unreacted titanium layer is removed and a barrier layer is formed on the titanium silicide layer. A platinum layer is then deposited and patterned over the barrier layer, followed by a high dielectric constant layer which is followed by the deposition of a cell plate (preferably platinum) to form the capacitor. Although a high dielectric constant capacitor is formed, the capacitor has a low (i.e., relatively small) surface area. Furthermore, if the platinum layer is not properly patterned (i.e., misaligned) such that the barrier layer is exposed, oxidation of the barrier layer, the titanium silicide layer, and the conductive plug may occur.

Although the formation of high dielectric constant capacitors is known, forming such high dielectric constant capacitors with relatively large surface area structures, such as fins and cylinders, to further increase their storage capacitance is not feasible. This infeasibility may be attributed to an electric field which forms when the capacitor is in operation. If a thin structure, such as a fin, is formed in an effort to increase surface area, this electric field becomes particularly intense at the corners or edge of the thin structure. This intense electric field can break down the dielectric material, which breakdown can result in capacitor failure.

Therefore, it would be advantageous to develop a technique for forming a relatively large surface area, high dielectric constant capacitor, and RAM chips, memory cells, and capacitors employing same, while using inexpensive, commercially available, widely practiced semiconductor device fabrication techniques and equipment without requiring complex processing steps.

SUMMARY OF THE INVENTION

The present invention includes a novel memory cell capacitor and techniques for the formation of the memory cell capacitor which allow for, and promote, utilization of the advantages of relatively large surface area structures and high dielectric constant materials. The present invention utilizes a buffer material as a cap on the edge surfaces of the relatively large surface area structures to dampen or eliminate the intense electric field which is generated at the edge surfaces of the relatively large surface area structures during the operation of the capacitor.

The method of the present invention is practiced after the formation of an intermediate structure comprising transistor gates on a silicon substrate which has been oxidized to form thick field oxide areas and which has been exposed to implantation processes to form drain and source regions. The intermediate structure further comprises at least one barrier layer which covers the transistor gates and the silicon substrate.

The method of the present invention comprises patterning a first resist layer on the barrier layer, which is then etched to expose the drain regions in the substrate, forming vias. The resist layer is then stripped and a layer of conductive polysilicon material is applied over the structure to fill the vias. The polysilicon material is etched such that it is recessed within the vias. If oxidation of the polysilicon material during subsequent processing steps is a problem, a shield material may be applied and spacer etched to form a shield layer between the polysilicon material and the gates, and the barrier layer.

A layer of metal is applied over the structure. The structure is then heated, which causes a silicide reaction wherever the metal layer contacts the polysilicon material to form a metal silicide layer within the vias. The unreacted portion of the metal layer is then selectively removed, leaving the metal silicide layer covering the polysilicon material.

A metal barrier layer is applied over the metal silicide layer and the barrier layer. The metal silicide layer and metal barrier layer prevent the out diffusion of silicon from the polysilicon material (during subsequent heat steps) into a cell node which is to be formed above the metal barrier layer.

A resist layer is then applied over the metal barrier layer to substantially fill the vias. The resist layer is then etched such that plugs of the resist layer remain in the vias. The metal barrier layer is then etched to form a bottom contact adjacent the metal silicide layer. The resist plugs are then stripped away.

A layer of conductive material is deposited over the barrier layer and into the vias, thereby substantially filling the same, to contact the bottom contact. The conductive material is then patterned and etched to form electrically isolated, individual storage nodes which have relatively large surface area structures. These relatively large surface area structures can take the form of walls, columns, pins, annular circles, wedges, cones, or any such shape. A common element of each of these relatively large surface area structures is that each of them will have a relatively thin edge portion, surface, or shape edge where the conductive material is patterned. The material used to pattern the conductive material may be left on these edge portions or a buffer material may be added to these edge portions by any known techniques to form a cap on the edge portions.

One embodiment of etching conductive material comprises depositing a layer of oxide material over the conductive material layer. A resist layer is patterned and the oxide material is etched to form an opening, preferably circular, and to expose portions of the conductive material layer. Preferably, one edge of each opening is substantially centered in the center of the underlying polysilicon material.

The patterned resist layer is stripped and a mask material layer is deposited over the etched oxide material and the exposed conductive material layer. The mask material layer is then etched to form spacers. The etched oxide material is etched to leave the spacers free standing. The pattern of the spacers is transferred down through the conductive material layer and, preferably, into a portion of the barrier layer to form at least one relatively large surface area structure, such as a fin, in the conductive material layer. The transfer of the spacer pattern results in the conductive material layer forming electrically isolated, individual storage nodes with the spacers remaining on the edge portions of the relatively large surface area structure as the buffer material to form the cap.

After the relatively large surface area structures are formed with the cap on the edge portions thereof, a layer of high dielectric constant material is deposited over the etched structure. The capacitors are completed by depositing an upper cell plate, preferably platinum, over the high dielectric constant material.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

FIGS. 1–24 illustrate a technique for forming a high dielectric constant cell capacitor for a memory cell. It should be understood that the figures presented in conjunction with this description are not meant to be illustrative of actual cross-sectional views of any particular portion of an actual semiconductor device, but are merely idealized representations which are employed to more clearly and fully depict the process of the invention than would otherwise be possible.

Figure 1:
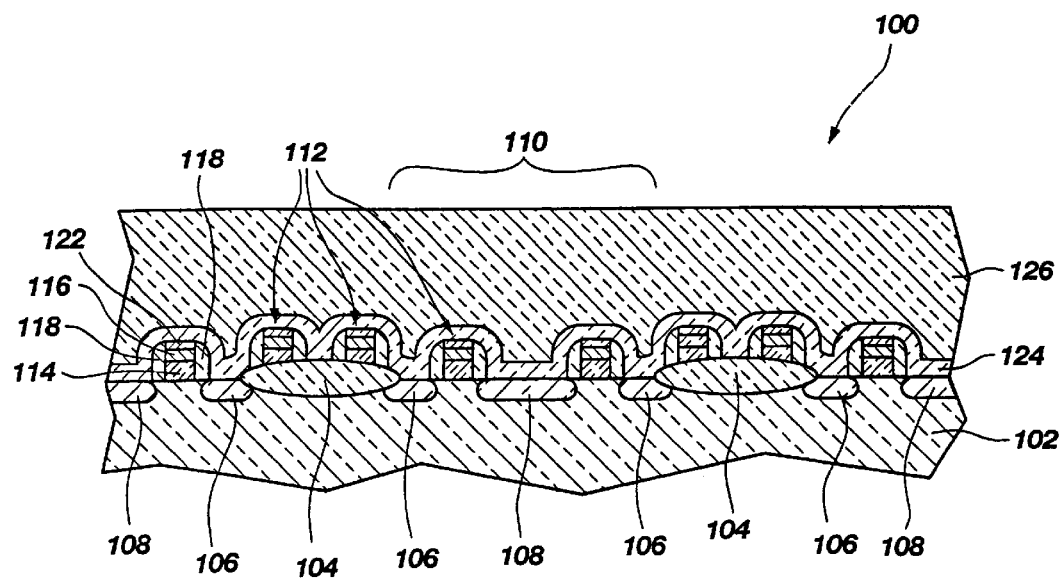
FIGS. 1–27 illustrate cross-sectional and plan views of a method of fabricating a high dielectric constant capacitor for a memory cell according to the present invention.

FIG. 1 illustrates a cross-sectional view of an in-process intermediate structure 100 in the production of the memory cell array (i.e., a DRAM). This intermediate structure 100 comprises a substrate 102, such as a lightly doped P-type crystal silicon substrate, which has been oxidized to form thick field oxide areas 104 and exposed to implantation processes to form drain regions 106 and source regions 108 of N+ doping. Transistor gate members 112 are formed on the surface of the substrate 102, including transistor gate members 112 residing on a substrate active area 110 spanned between the drain regions 106 and the source regions 108 and transistor gate members 112 residing on the thick field oxide areas 104. The transistor gate members 112 each comprise a lower buffer layer 114, preferably made of silicon dioxide, separating a gate conducting layer or wordline 116 of the transistor gate member 112 from the substrate 102. Transistor insulating spacer members 118, preferably made of silicon nitride, are formed on either side of each transistor gate member 112. A cap insulator 122, also preferably made of silicon nitride, is formed on the top of each transistor gate member 112. A first barrier layer 124 (preferably made of tetraethyl orthosilicate (TEOS), or the like) is applied over the transistor gate members 112 and the substrate 102. A second barrier layer 126 (preferably made of borophosphosilicate glass—BPSG, phosphosilicate glass—PSG, borosilicate glass—BSG, or the like) is deposited over the first barrier layer 124. The second barrier layer 126 may be optionally planarized, if necessary, preferably using an abrasive process, such as chemical mechanical planarization (CMP).

It is, of course, understood that a single barrier layer could be employed. However, a typical barrier configuration is a layer of TEOS over the transistor gate members 112 and the substrate 102 followed by a BPSG layer over the TEOS layer. The TEOS layer is applied to prevent dopant migration. The BPSG layer contains boron and phosphorus which can migrate into the source and drain regions formed on the substrate during inherent device fabrication heating steps. This migration of boron and phosphorus can change the dopant concentrations in the source and drain regions which can adversely affect the transistor performance.

Figure 2:
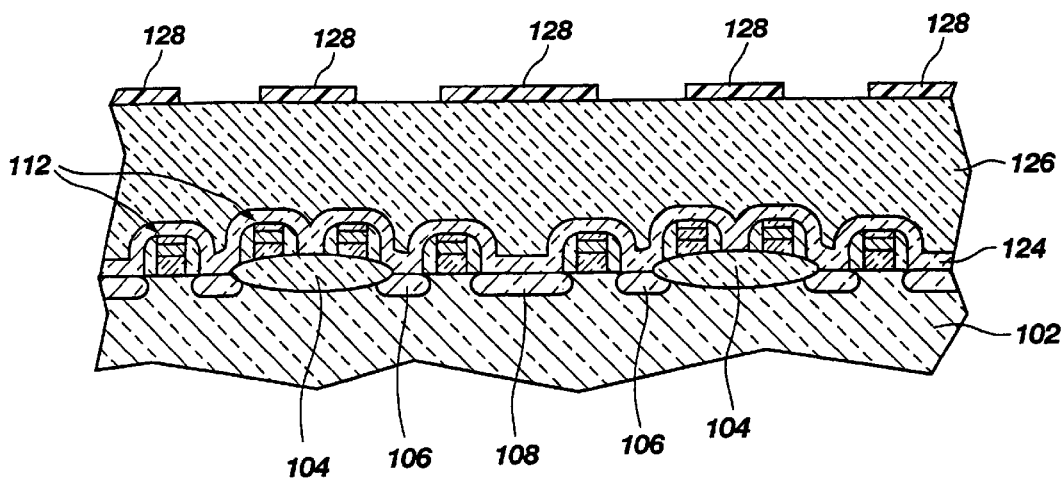
Figure 3:
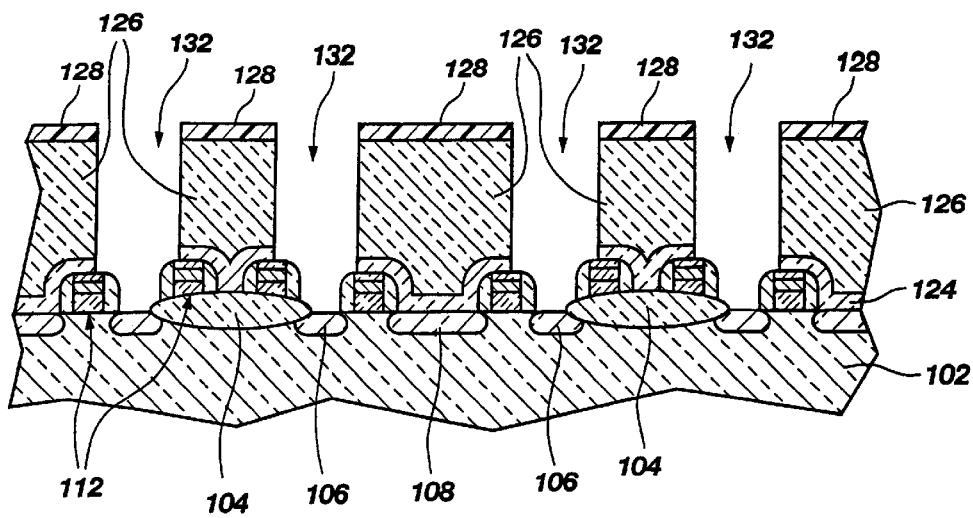
Figure 4:
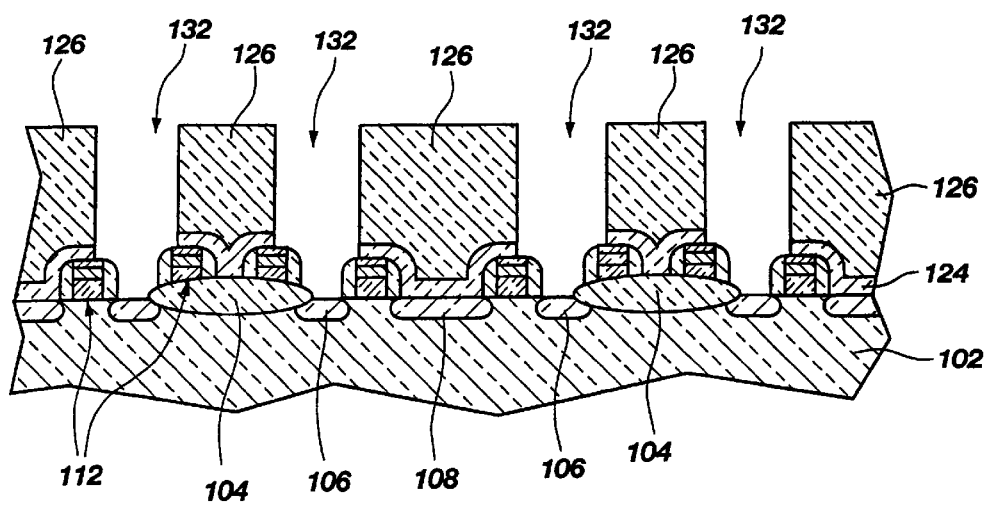
Figure 5:
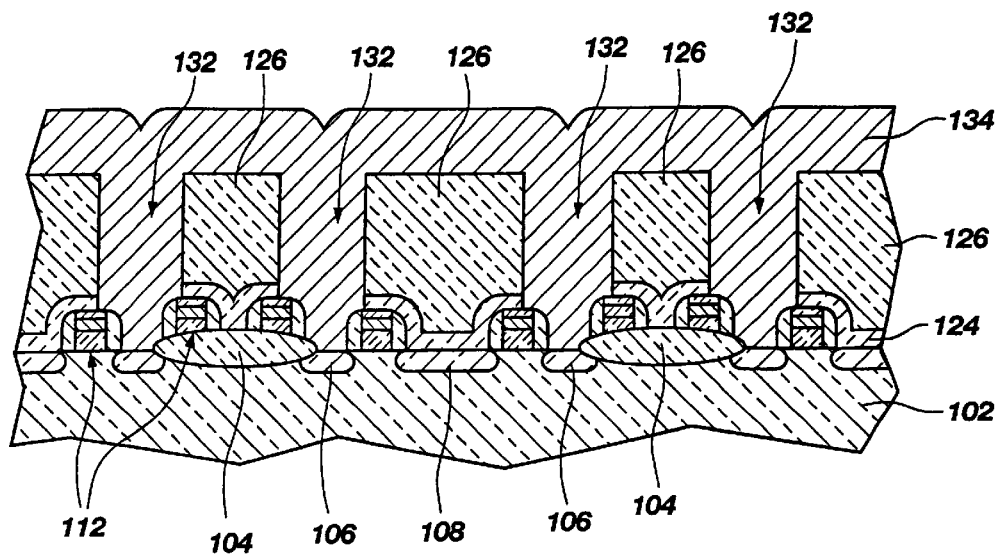
Figure 6:
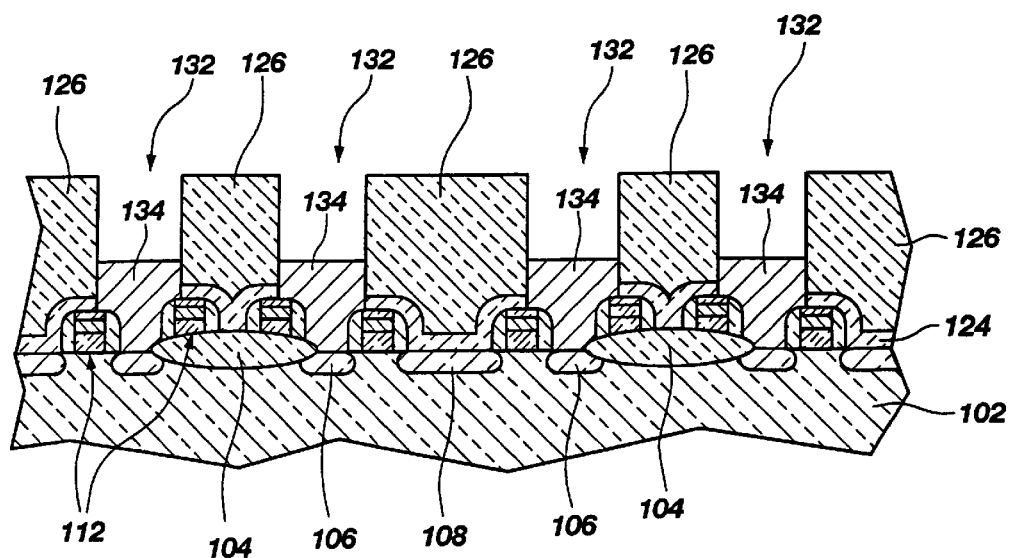
Figure 7:
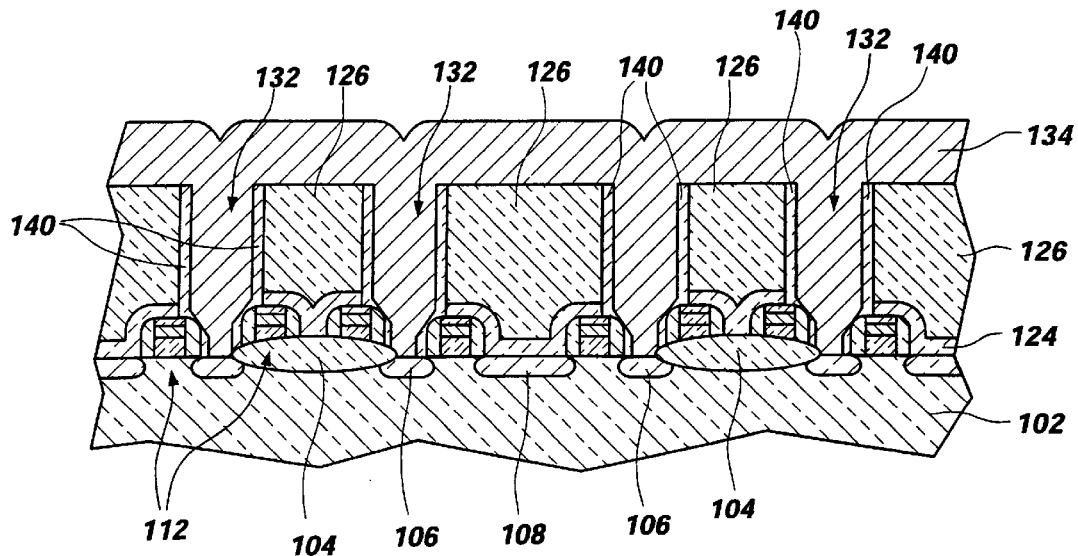

A first resist layer 128 is patterned, as shown in FIG. 2, and the second barrier layer 126 and the first barrier layer 124 are etched to expose the drain regions 106 in the substrate 102, forming vias 132, as shown in FIG. 3. The first resist layer 128 is then stripped, as shown in FIG. 4, and a layer of conductive polysilicon material 134 is applied over the structure to fill the vias 132, as shown in FIG. 5. The polysilicon material 134 is etched such that it is recessed within the vias 132, as shown in FIG. 6. This may be achieved with CMP, wet etch, dry etch, or a combination thereof. If oxidation of the polysilicon material 134 during subsequent processing steps (such as dielectric layer formation) is a problem, a shield material, such as a silicon nitride material, may be applied and spacer etched to form a shield layer 140 between the polysilicon material 134 and the gate members 112, the first barrier layer 124, and the second barrier layer 126, as shown in FIG. 7.

Figure 8:
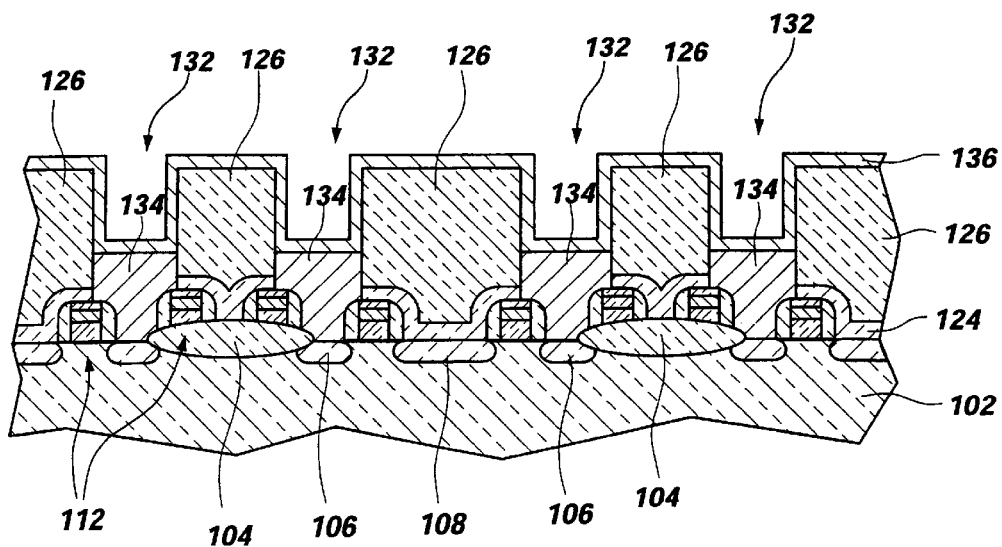
Figure 9:
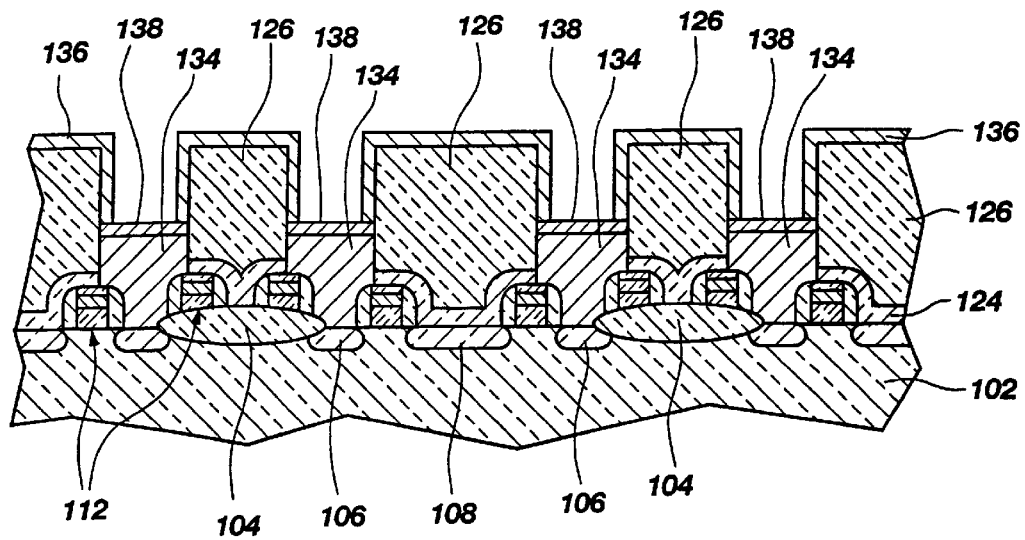
Figure 10:
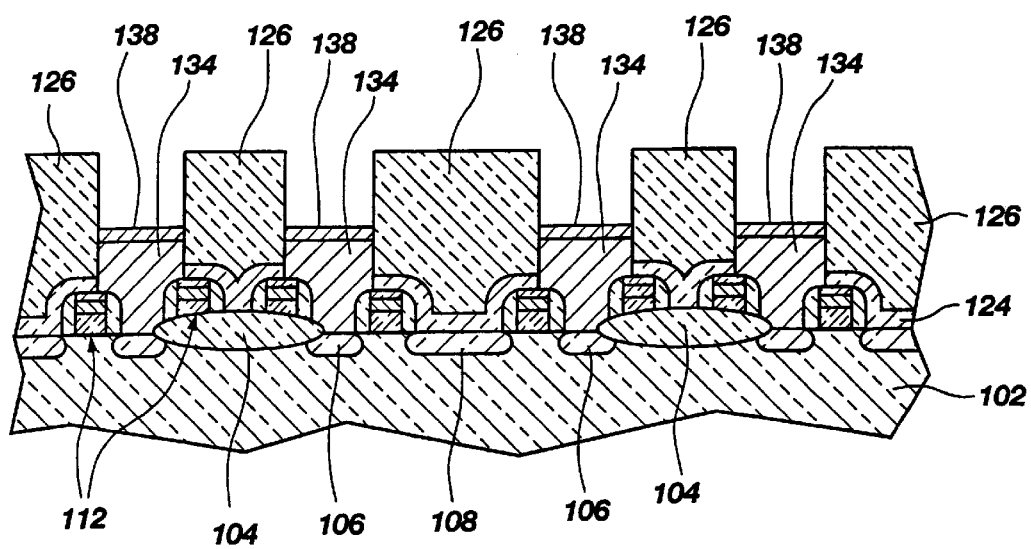

A layer of metal 136, preferably titanium, is applied over the structure, such as by chemical vapor deposition or by sputter deposition, as shown in FIG. 8. The structure is heated, which causes a silicide reaction wherever the metal layer 136 contacts the polysilicon material 134 to form a metal silicide layer 138, such as titanium silicide ($TiSi_2$), as shown in FIG. 9. The unreacted metal is then selectively removed through the use of an etchant that does not attack the metal silicide layer 138 or the second barrier layer 126, preferably an ammonium hydroxide/peroxide strip. This leaves the metal silicide layer 138 covering the polysilicon material 134, as shown in FIG. 10.

Figure 11:
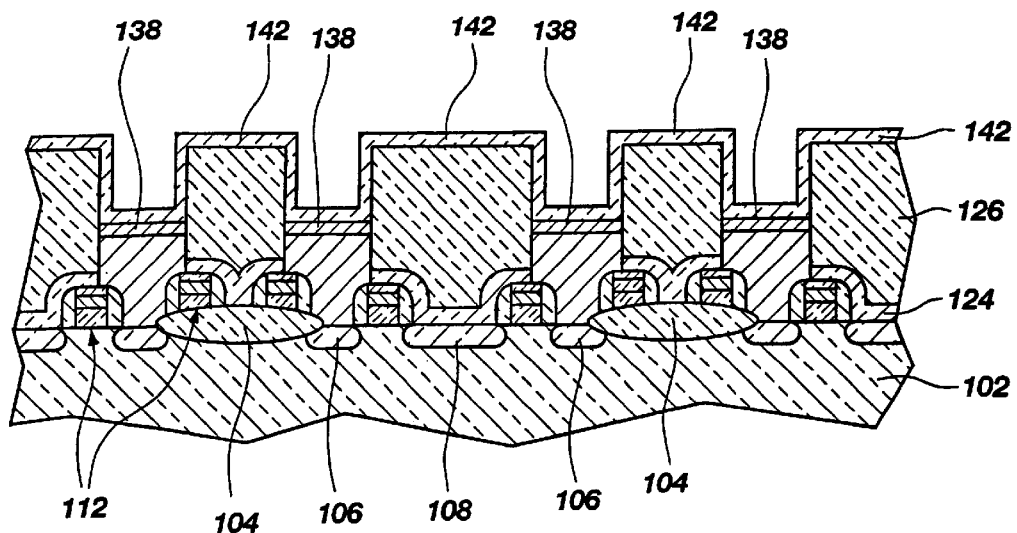

A metal barrier layer 142, preferably TiN, TiAlN, or the like, is applied over the metal silicide layer 138 and the second barrier layer 126, as shown in FIG. 11. The metal barrier layer 142 prevents the out diffusion of silicon from the polysilicon material 134 (during subsequent heat steps) to a cell node which is to be formed above the metal barrier layer 142.

Figure 12:
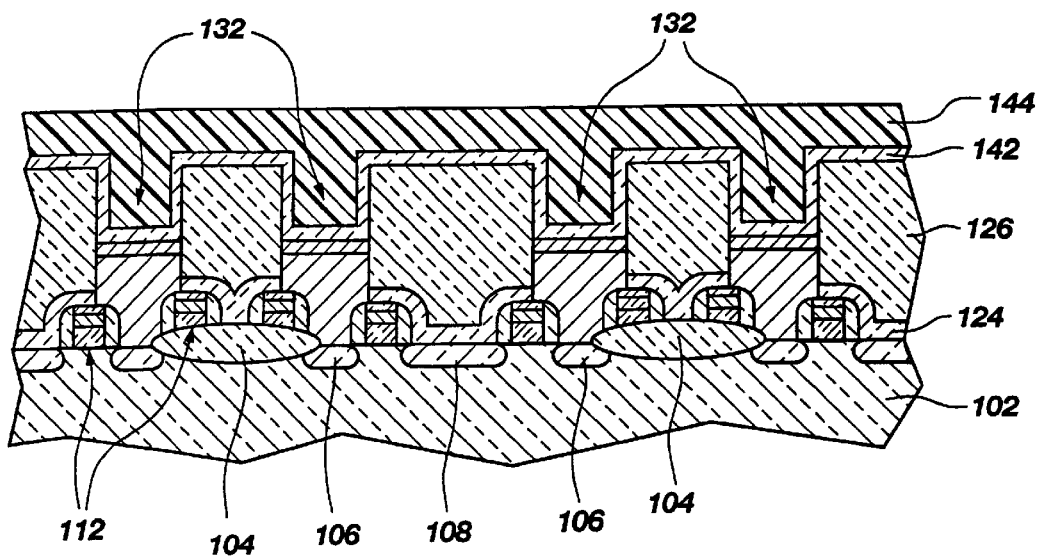
Figure 13:
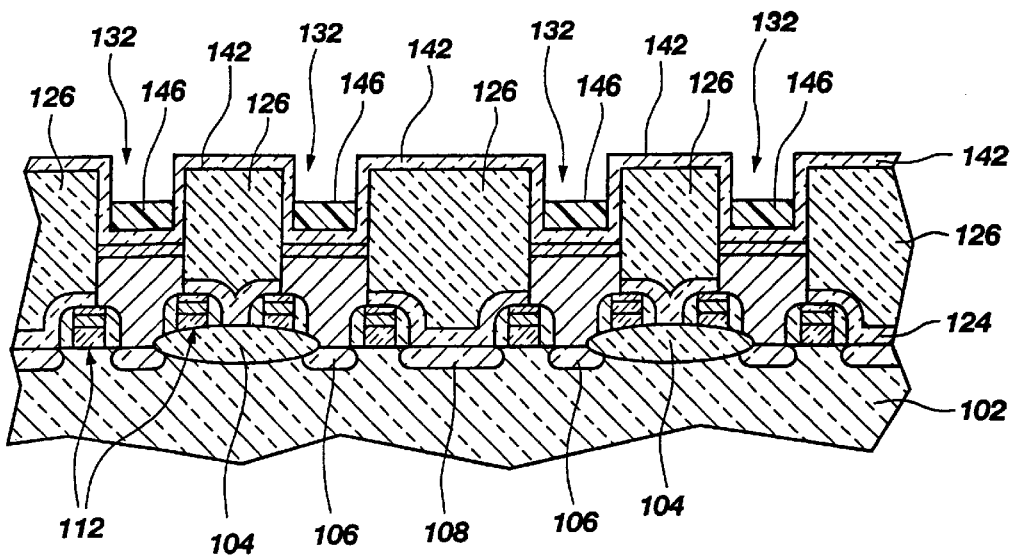
Figure 14:
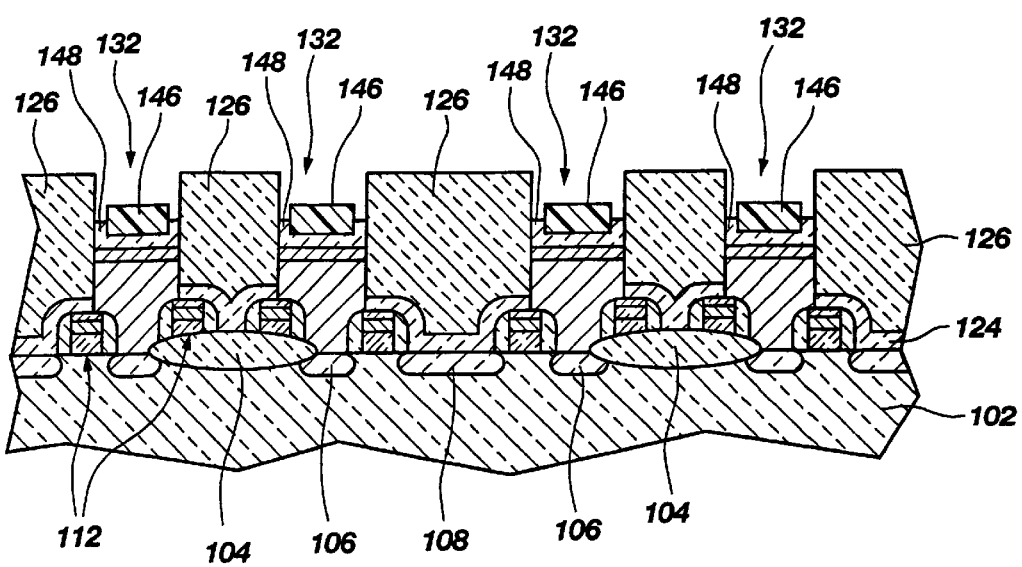
Figure 15:
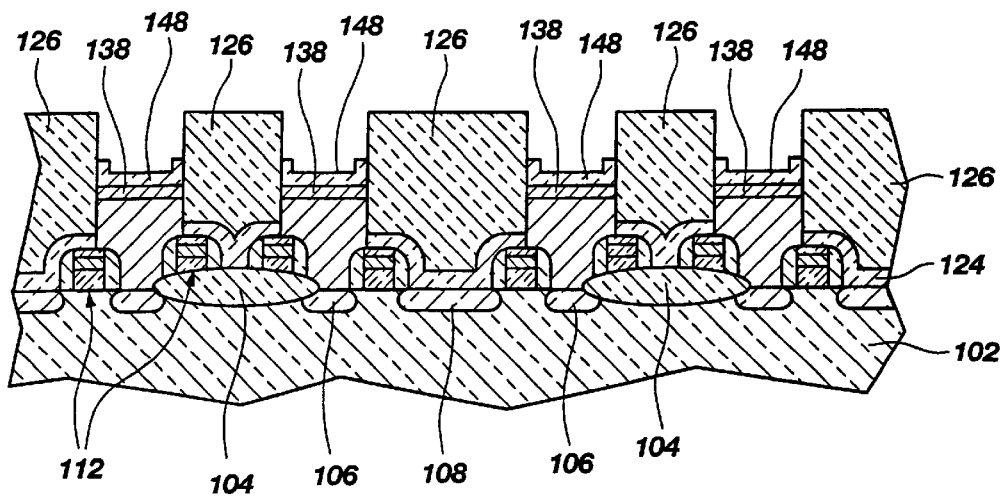

A resist layer 144 is then applied, preferably by spin deposition, over the metal barrier layer 142 to substantially fill the vias 132, as shown in FIG. 12. The resist layer 144 is then etched, preferably using an oxygen plasma dry etch, such that resist plugs 146 remain in the vias 132, as shown in FIG. 13. The metal barrier layer 142 is then etched, preferably by a wet etch using ammonium hydroxide/peroxide, sulfuric acid/peroxide, or the like, to form a bottom contact 148, as shown in FIG. 14. The resist plugs 146 are then stripped away, preferably with an oxygen dry etch, as shown in FIG. 15.

Figure 16:
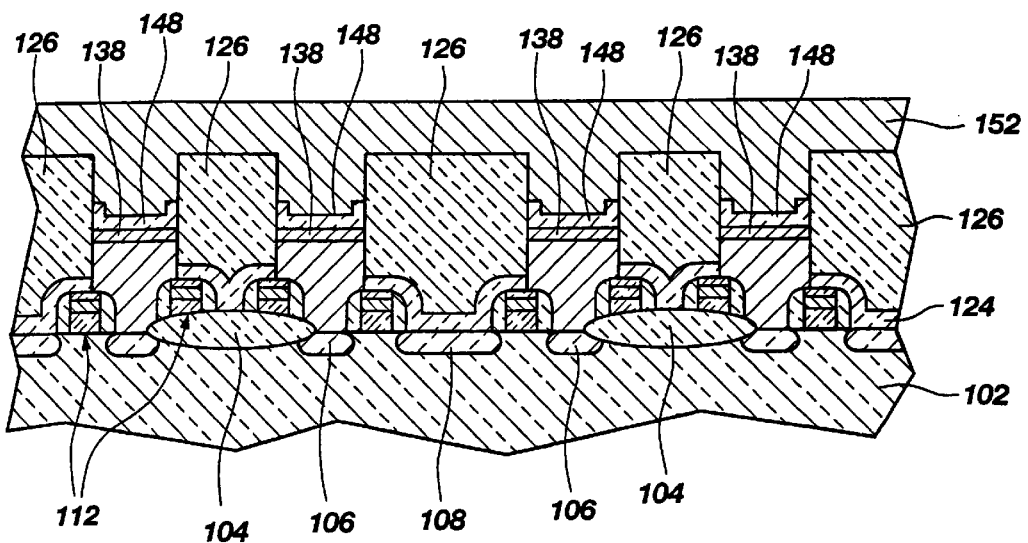
Figure 17:
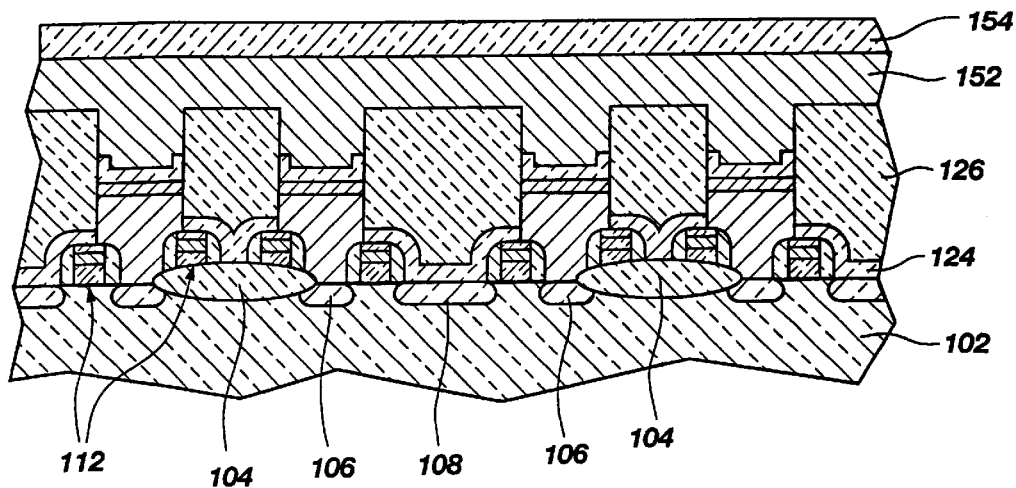
Figure 18:
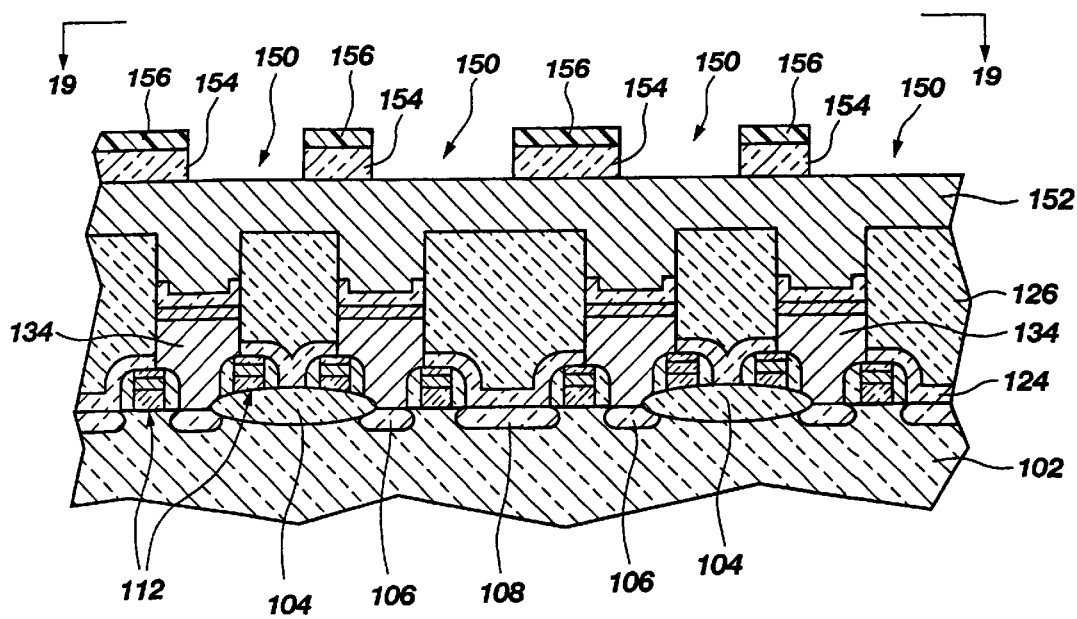
Figure 19:
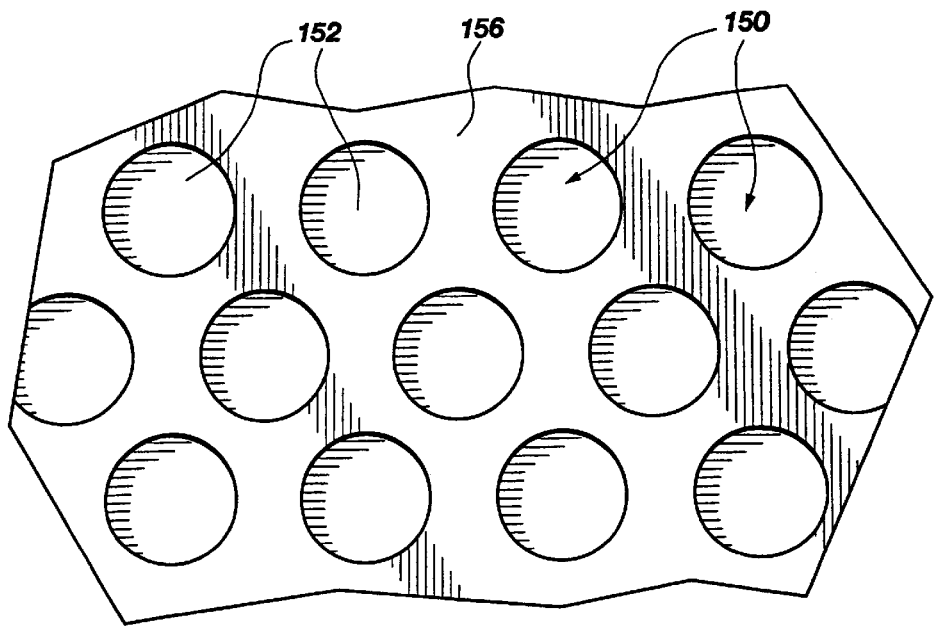

A layer of conductive material 152, preferably platinum, is deposited over the second barrier layer 126 and into the vias 132 to contact the bottom contact 148, as shown in FIG. 16. The conductive material layer 152 is preferably planarized and a layer of oxide material 154, preferably TEOS, is deposited over the conductive material layer 152, as shown in FIG. 17. A second resist layer 156 is patterned and the oxide material 154 is etched to form openings 150, preferably circular openings offset from vias 132, and expose portions of the conductive material layer 152, as shown in FIG. 18. Preferably, one edge of each opening 150 is substantially centered over the center of the underlying polysilicon material 134. FIG. 19 illustrates a top plan view of the openings 150 along lines 19—19 of FIG. 18.

Figure 20:
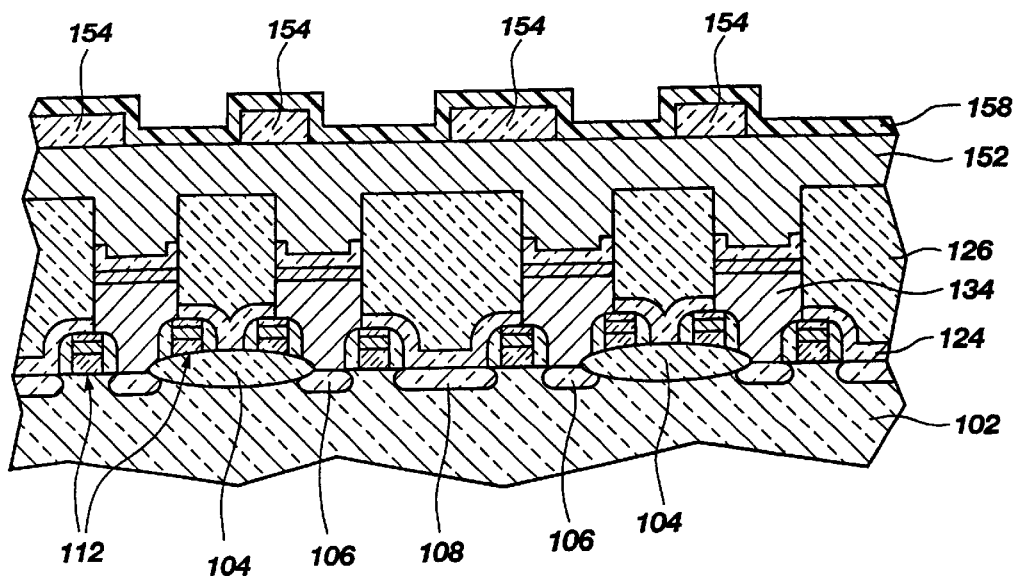
Figure 21:
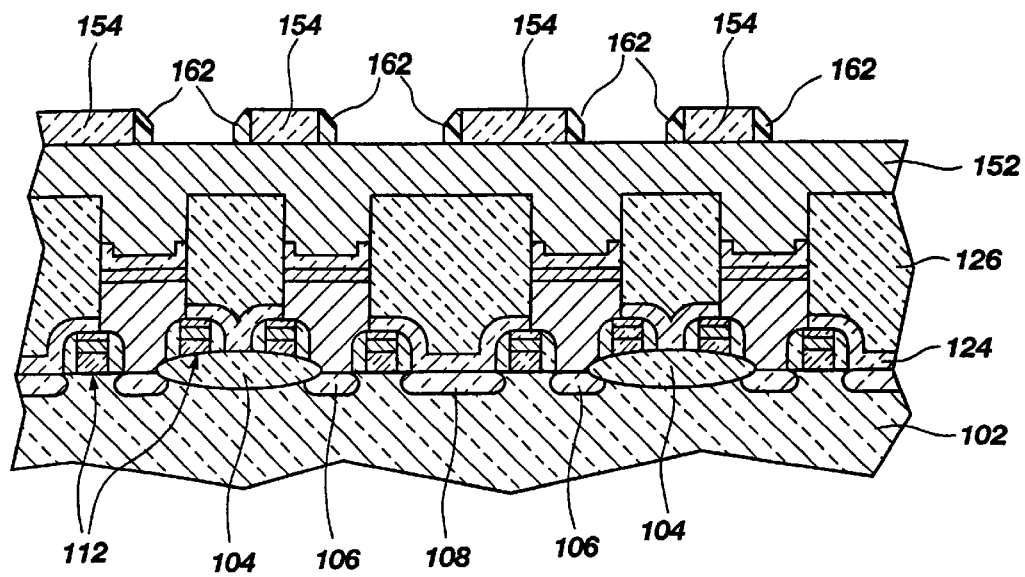
Figure 22:
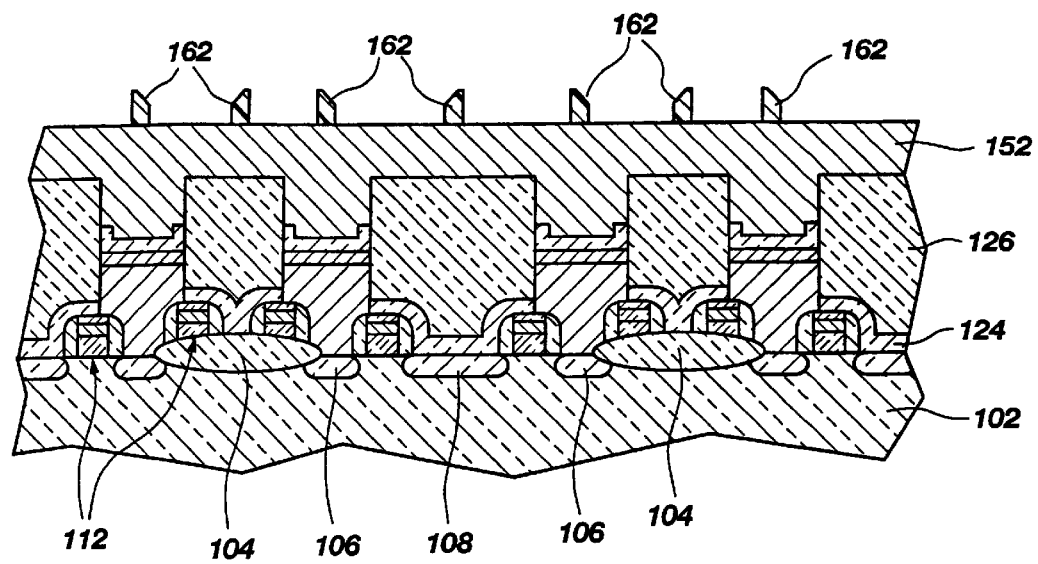
Figure 23:
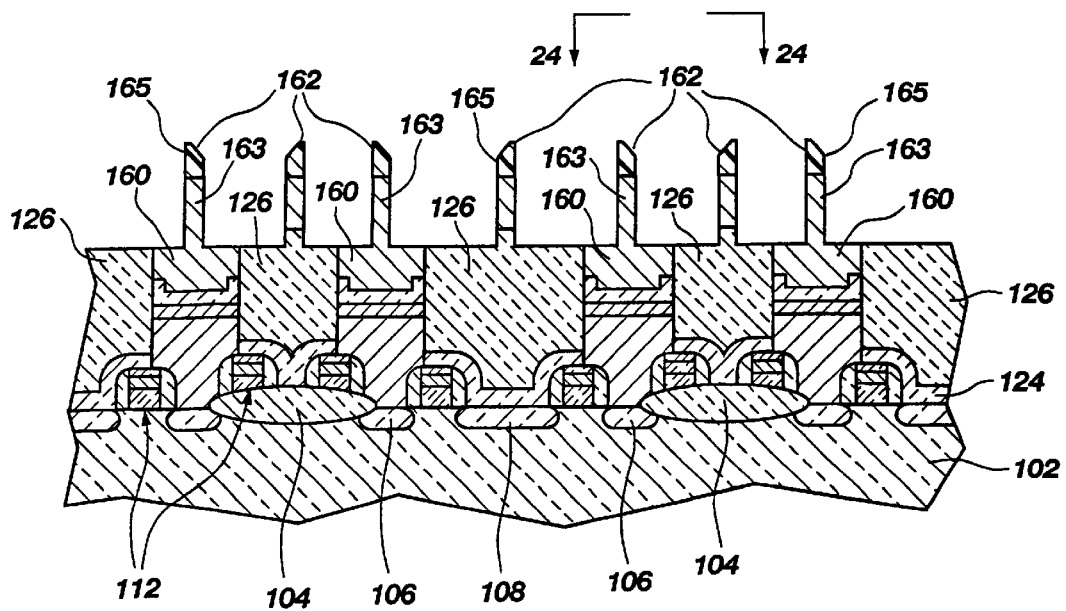
Figure 24:
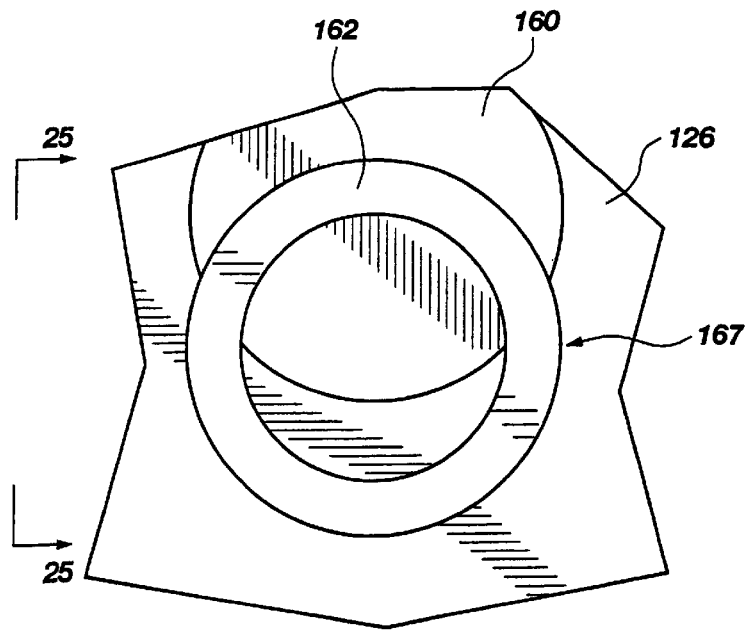
Figure 25:
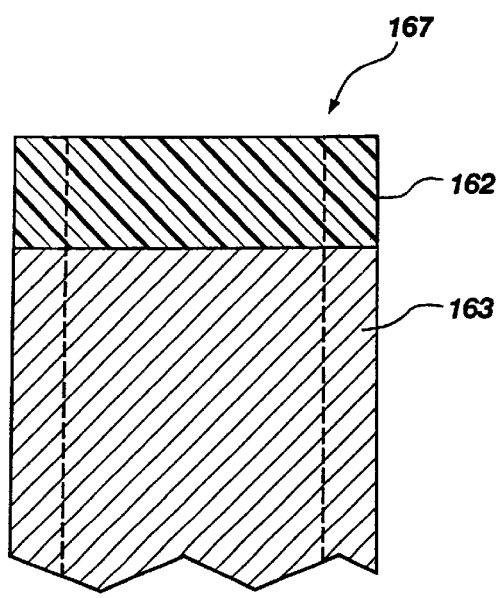

As shown in FIG. 20, the patterned second resist layer 156 is stripped and a mask material layer 158, preferably silicon nitride, is deposited over the etched oxide material 154 and the exposed conductive material layer 152. The mask material layer 158 is then etched, preferably comprising a spacer etch, to form insulative spacers 162, as shown in FIG. 21. The etched oxide material 154 is selectively etched (selective to the mask material layer) to leave the insulative spacers 162 free standing, as shown in FIG. 22. The pattern of the insulative spacers 162 is transferred down through the conductive material layer 152, preferably by ion milling or dry etching and, preferably, into a portion of the second barrier layer 126 to form relatively large surface area or thin structures, such as annular walls 163, in the conductive material layer 152, as shown in FIG. 23. The transfer of the spacer pattern results in the conductive material layer 152 forming electrically isolated, individual cell nodes 160 with the insulative spacers 162 remaining on the uppermost edges of thin portions 165 of the relatively large surface area structures, such as annular walls 163, to form caps of buffer material. FIG. 24 illustrates a top plan view of an annular structure 167 formed by the previously discussed method along lines 24—24 of FIG. 23. FIG. 25 is a side plan view of the upper portion of the annular structure 167 along lines 25—25 of FIG. 24.

It is, of course, understood that the insulative spacers/caps 162 can be defined by patterning and etching the conductive material, by any known technique, to create the electrically isolated, individual cell nodes 160 including relatively large surface area structure or annular wall 163. These relatively large surface area structures 163 will, of course, have thin portions or edge surfaces 165 (see FIG. 23) where the conductive material layer 152 is patterned. The material used to pattern the conductive material layer 152 may be left on these edge surfaces 165 as a cap, or a cap of buffer material may be added to the outer edges of these edge surfaces 165 by any known techniques.

Figure 26:
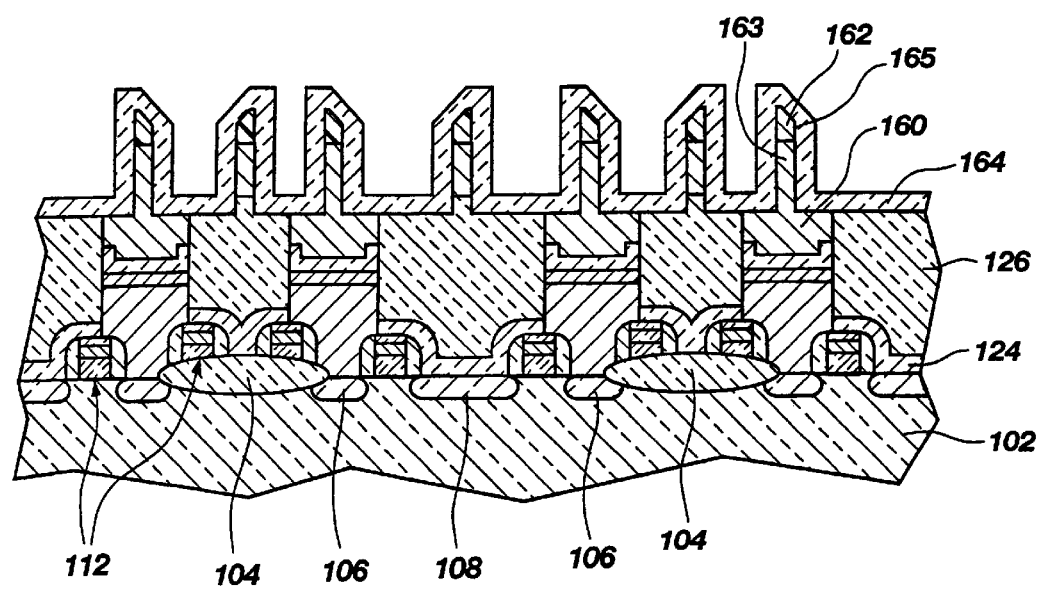
Figure 27:
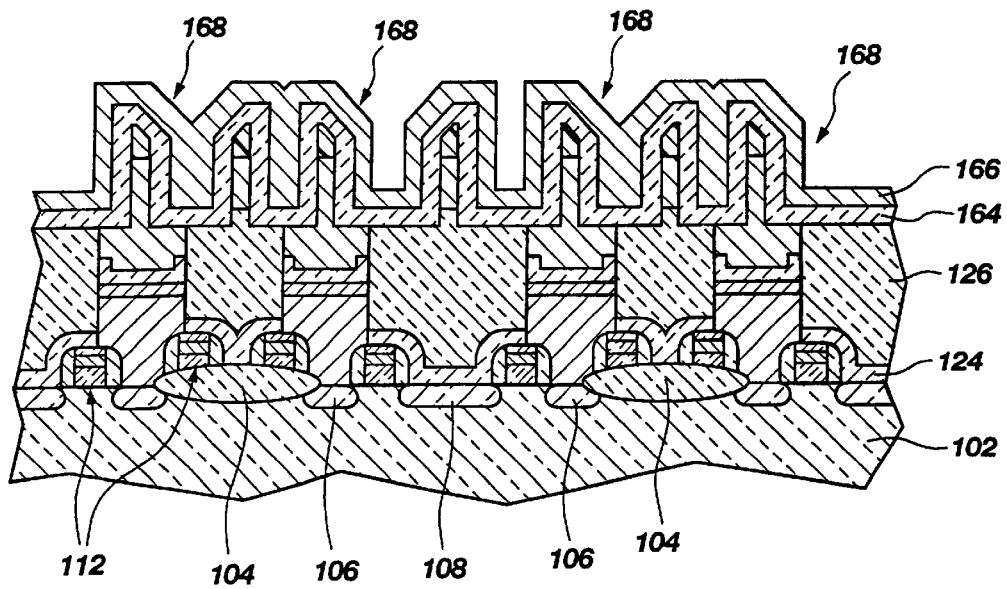

A layer of high dielectric constant material 164, preferably a BST (barium-strontium-titanate) material, is deposited over the etched structure, as shown in FIG. 26. The capacitors 168 are completed by depositing an upper cell plate 166, preferably platinum, over the high dielectric constant material 164, as shown in FIG. 27.

Figure 28:
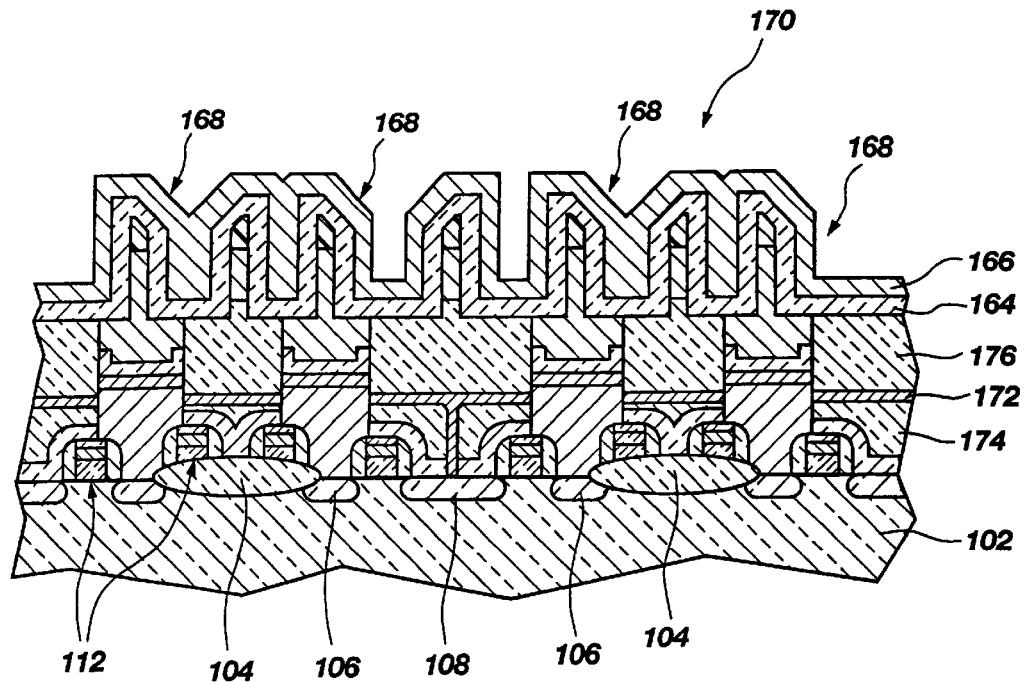
FIG. 28 illustrates a cross-sectional view of a high dielectric constant capacitor for a memory cell having a buried bit line according to the present invention.

After the formation of the capacitors 168, bit lines, comprising a conductive material, may be formed to extend into and contact the source regions 108. However, the bit lines may be disposed within the second barrier layer 126 prior to the formation of the capacitors 168. This is accomplished by depositing a first portion 174 of the second barrier layer 126, forming a bit line 172 to contact the source region 108, by any known technique, and depositing a second portion 176 of the second barrier layer 126. This would result in a final structure 170 with a buried bit line 172, as shown in FIG. 28.

Figure 29:
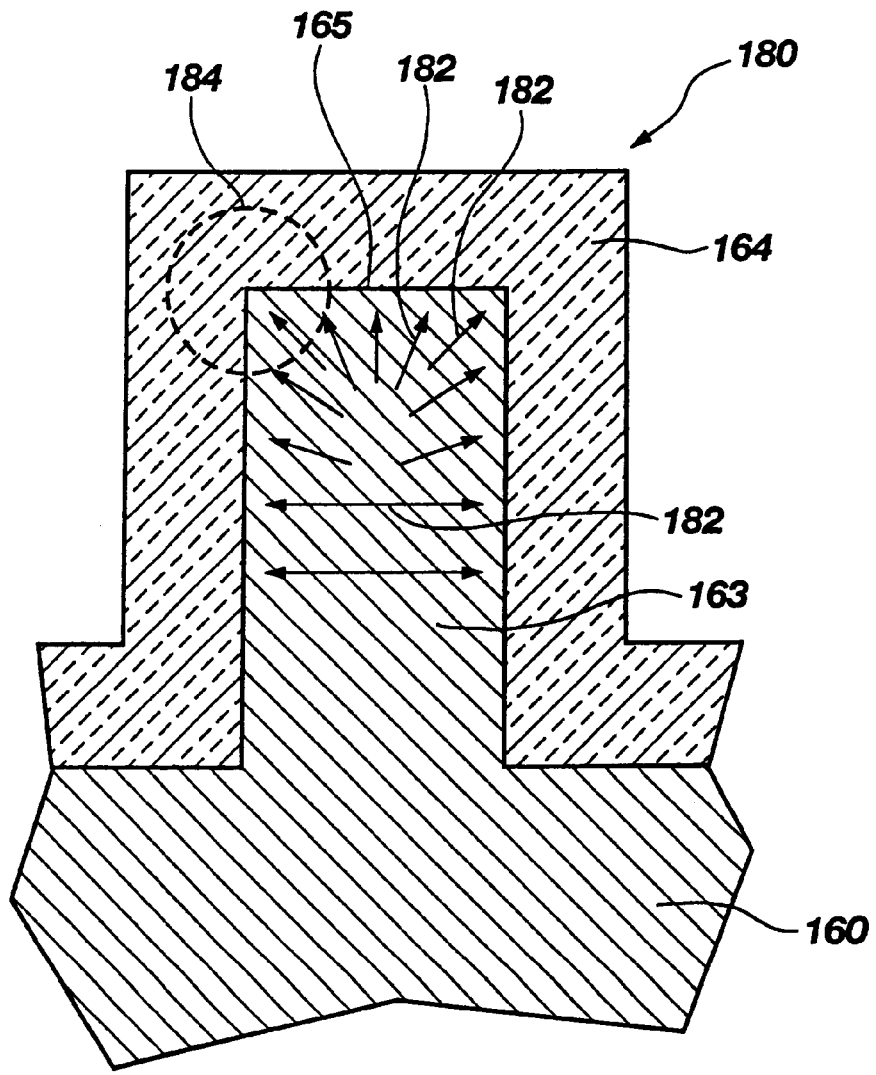
FIG. 29 illustrates a cross-sectional view of a thin structure on a high dielectric constant capacitor.
Figure 30:
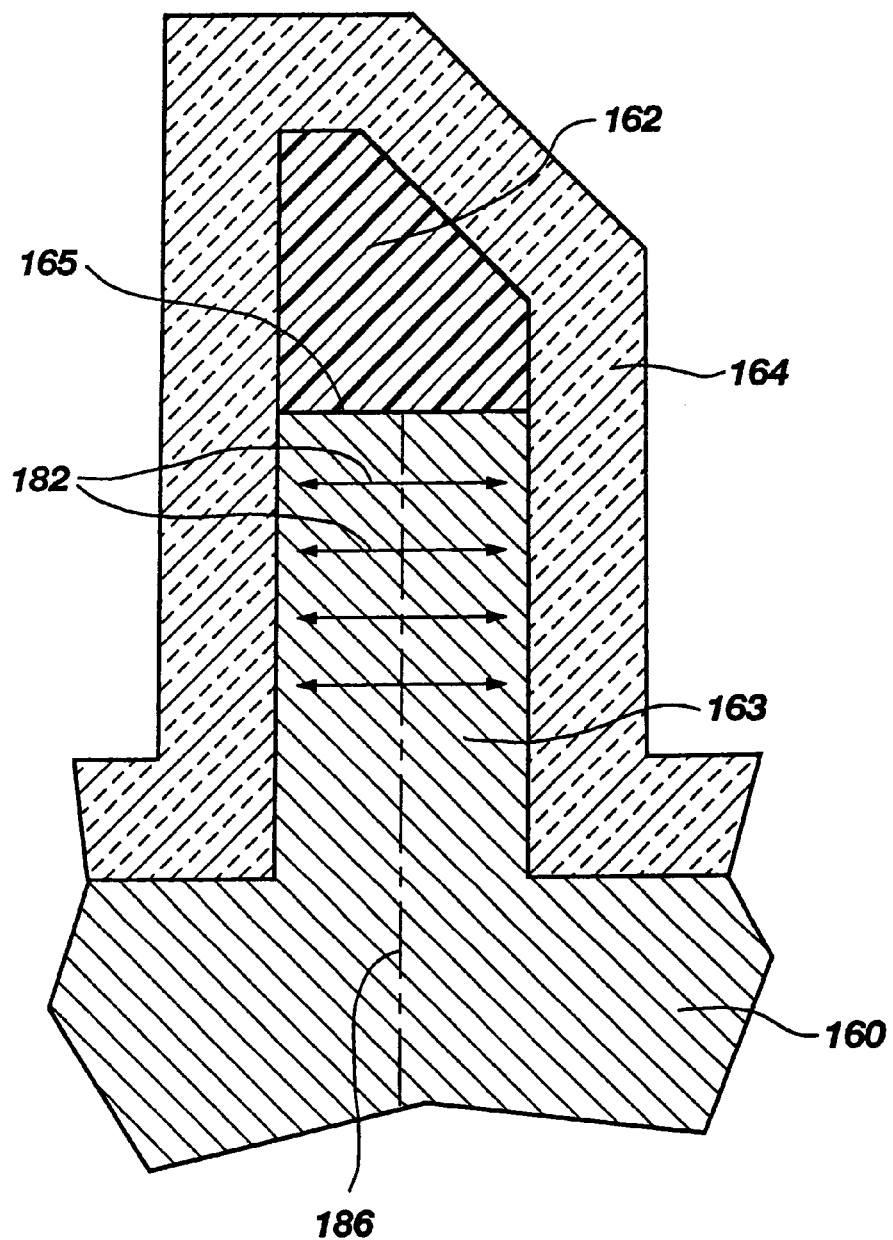
FIG. 30 illustrates a cross-sectional view of a thin structure on a high dielectric constant capacitor having a cap according to the present invention.

The present invention provides a substantial improvement in the electric field damping effect of the insulative spacer 162 on the annular walls 163. When thin structures 180 are used in a high dielectric constant capacitor (see FIG. 29), during the operation of the capacitor, an electric field 182 (represented by arrows) present in the capacitor structure is particularly intense at the outer corners 184 of the thin annular wall 163 and the edge surface 165 of the thin annular wall 163 defined therebetween, due to the relatively small surface area toward which the field is formed. The electric field 182 thus breaks down the high dielectric constant material 164 at one or more portions of the outer edge surface 165 of the annular walls 163, which breakdown results in capacitor failure. The present invention substantially reduces or eliminates the effects of the intense electric field 182 at the corners 184 of the thin structure 180. As shown in FIG. 30, the presence of the insulative spacer 162 atop the annular wall 163 (e.g., the thin structure) acts as an insulator or dampening mechanism on the top of the annular wall 163. The insulative spacer 162 keeps the intense electric field from forming in the corners 184 of the annular wall 163 by providing a large dielectric barrier between the outer edges of the annular wall 163 and the upper cell plate 166 (not shown in FIG. 30). Thus, the electric field 182 is formed to extend only substantially perpendicular to a centerline 186 of the annular wall 163.

Yet another substantial improvement in the present invention is in the isolation of the polysilicon material 134 from the high dielectric constant material 164. The polysilicon material 134 is generally used to make electrical contact with the substrate 102, because the polysilicon material 134 will not contaminate the substrate 102. However, most of the high dielectric constant materials 164, such as BST, are formed in highly oxidative environments. If the polysilicon material 134 comes into contact or is proximate to such an environment, the polysilicon material 134 will oxidize and become less conductive. Thus, the structure and method of formation of the high dielectric constant capacitor of the present invention isolates the polysilicon material 134 from such oxidation by recessing the polysilicon material 134 away from the high dielectric constant material layer 164, as shown in FIGS. 26 and 27.

Figure 31:
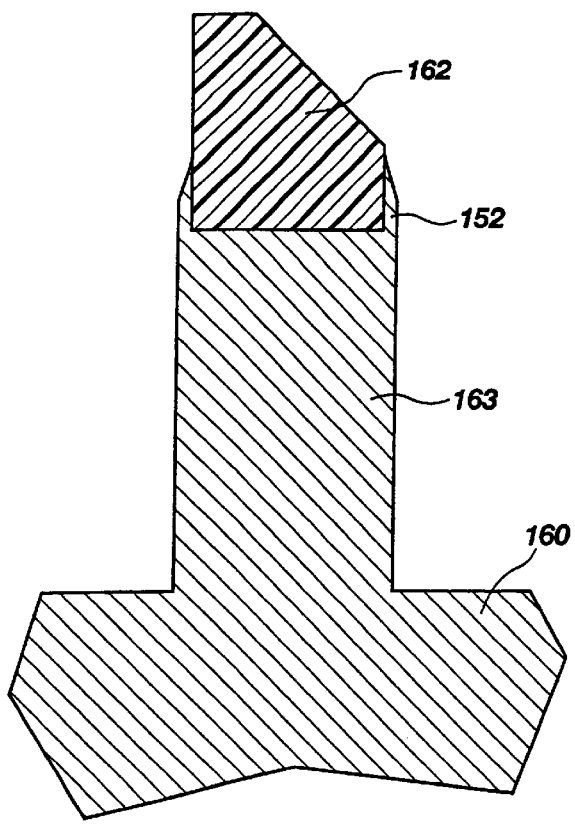
FIG. 31 illustrates a thin structure for a high dielectric constant capacitor having a cap according to the present invention with a certain amount of redeposition of a conductive material layer thereon.
Figure 32:
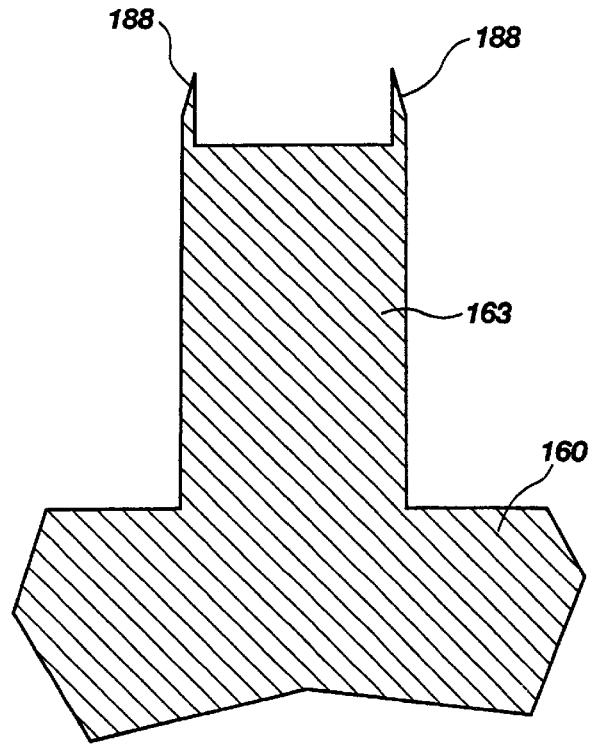
FIG. 32 illustrates the thin structure of FIG. 31 with the cap removed.

Yet still another advantage of the present invention is the allowance for a certain amount of redeposition of the conductive material layer 152 on the insulative spacer 162. As shown in FIG. 31, some conductive material layer 152 may redeposit on the insulative spacer 162 during the formation of the individual cell nodes 160, as discussed and illustrated with FIGS. 22 and 23. If the insulative spacer 162 were removed after such conductive material layer 152 redeposition, sharp protrusions 188 may remain, as shown in FIG. 32. These sharp protrusions 188 may result in shorting since subsequently deposited high dielectric constant material will be very thin over the sharp protrusions 188.

It is, of course, understood that the insulative spacer 162 need not be left on or subsequently formed to provide the caps. The tip portions of the annular walls 163 may be rendered non-conductive through physical and/or chemical processes, thereby providing the buffer material or non-conductive caps.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method for fabricating a capacitor, comprising:
   providing conductive material in electrical communication with a region of a semiconductor substrate;
   removing portions of the conductive material to form protruding structures including edge portions;
   providing an insulative buffer material along the edge portions;
   applying a dielectric material over the protruding structures; and
   applying conductive material over the dielectric material.

2. The method of claim 1, wherein:
   providing the insulative buffer material comprise forming a mask comprising the insulative buffer material prior to removing;
   removing the portions of the conductive material comprises etching the conductive material through the mask; and
   a portion of the mask remains after etching the conductive material.

3. The method of claim 1, wherein applying the dielectric material comprises applying at least one of $Ba_xSr_{(Z-x)}TiO_3$, $BaTiO_3$, $SrTiO_3$, $PbTiO_3$, $Pb(Zr,Ti)O_3$, $(Pb,La,Zr,Ti)O_3$, $(Pb,La)TiO_3$, $KNO_3$, and $LiNbO_3$.

4. The method of claim 1, wherein providing the insulative buffer material comprises providing silicon nitride.

5. The method of claim 1, wherein providing the conductive material in electrical communication with the region of the semiconductor substrate comprises providing platinum in electrical communication with the region of the semiconductor substrate.

6. The method of claim 1, wherein applying the conductive material over the dielectric material comprises applying platinum over the dielectric material.

7. The method of claim 1, wherein removing comprises forming a mask on the conductive material and etching the conductive material through the mask.

8. The method of claim 7, wherein providing the insulative buffer material comprises leaving at least a portion of the mask on the conductive material following etching.

9. The method of claim 1, wherein providing the insulative buffer material is effected following removing.

10. A method for fabricating a memory cell, comprising:
    providing conductive material in electrical communication with a drain region of a semiconductor substrate;
    removing portions of the conductive material to form protruding structures;
    providing an insulative buffer material over edge portions of the protruding structures;
    applying a dielectric material over the protruding structures; and
    applying a conductive material over the dielectric material.

11. The method of claim 10, wherein:
    providing the insulative buffer material comprises forming a mask comprising the insulative buffer material prior to removing;

removing comprises etching the conductive material through the mask; and a portion of the mask remains after etching the conductive material.

12. The method of claim 10, wherein removing comprises forming a mask on the conductive material and etching the conductive material through the mask.

13. The method of claim 12, wherein providing the insulative buffer material comprises leaving at least a portion of the mask on the conductive material following etching.

14. The method of claim 10, wherein providing the insulative buffer material is effected following removing.

15. A method for fabricating a semiconductor DRAM, comprising:

providing conductive material in electrical communication with a drain region of a semiconductor substrate;

removing portions of the conductive material to form protruding structures;

providing an insulative buffer material over edge portions of the protruding structures;

applying a dielectric material over the protruding structures; and applying a conductive material over the dielectric material.

16. The method of claim 15, wherein:

providing the insulative buffer material comprises forming a mask comprising the insulative buffer material prior to removing;

removing comprises etching the conductive material through the mask; and a portion of the mask remains after etching the conductive material.

17. The method of claim 15, wherein removing comprises forming a mask on the conductive material and etching the conductive material through the mask.

18. The method of claim 17, wherein providing the insulative buffer material comprises leaving at least a portion of the mask on the conductive material following etching.

19. The method of claim 15, wherein providing the insulative buffer material comprises providing silicon nitride.

20. The method of claim 15, wherein providing the insulative buffer material is effected following removing.

21. A method for fabricating a capacitor, comprising:

providing conductive material in electrical communication with a drain region of a semiconductor substrate;

removing portions of the conductive material to form protruding structures including edge portions;

providing an insulative buffer material comprising silicon nitride along the edge portions;

applying dielectric material over the protruding structures; and applying conductive material over the dielectric material.

22. A method for fabricating a memory cell, comprising:

providing conductive material in electrical communication with a drain region of a semiconductor substrate;

removing portions of the conductive material to form protruding structures;

providing an insulative buffer material comprising silicon nitride over edge portions of the protruding structures;

applying dielectric material over the protruding structures; and applying conductive material over the dielectric material.

* * * * *

UNITED STATES PATENT AND TRADEMARK OFFICE
CERTIFICATE OF CORRECTION

PATENT NO. : 6,723,602 B2
APPLICATION NO. : 10/185836
DATED : April 20, 2004
INVENTOR(S) : Darwin A. Clampitt It is certified that error appears in the above-identified patent and that said Letters Patent is hereby corrected as shown below:

In the specification:
COLUMN 4, LINE 3, change "free standing." to --freestanding.--
COLUMN 6, LINE 31, change "free standing," to --freestanding,--
COLUMN 7, LINE 30, change "electric field from" to --electric field 182 from--
COLUMN 7, LINE 67, change "non-conductive" to --nonconductive--

In the claims:
CLAIM 2, COLUMN 8, LINE 22, change "material comprise" to --material comprises--

Signed and Sealed this

Sixth Day of November, 2007

JON W. DUDAS
*Director of the United States Patent and Trademark Office*